United States Patent
Akasaka et al.

(10) Patent No.: US 7,320,081 B2
(45) Date of Patent: Jan. 15, 2008

(54) CLOCK-SIGNAL GENERATION DEVICE, COMMUNICATION DEVICE, AND SEMICONDUCTOR DEVICE

(75) Inventors: Nobuhiko Akasaka, Kawasaki (JP); Toshiyuki Igarashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 490 days.

(21) Appl. No.: 10/386,659

(22) Filed: Mar. 13, 2003

(65) Prior Publication Data
US 2003/0204766 A1 Oct. 30, 2003

(30) Foreign Application Priority Data
Apr. 26, 2002 (JP) ............................. 2002-126561

(51) Int. Cl.
*G06F 1/04* (2006.01)
(52) U.S. Cl. ............... 713/500; 713/500; 713/400; 327/100; 326/93
(58) Field of Classification Search ............... 713/500, 713/400; 326/93; 327/100
See application file for complete search history.

(56) References Cited

U.S. PATENT DOCUMENTS

| | | | |
|---|---|---|---|
| 4,050,096 A | * 9/1977 | Bennett et al. | 711/167 |
| 4,105,978 A | * 8/1978 | Goss et al. | 327/114 |
| 4,636,656 A | * 1/1987 | Snowden et al. | 327/174 |
| 5,646,564 A | * 7/1997 | Erickson et al. | 327/158 |
| 5,757,807 A | 5/1998 | Tezuka et al. | |
| 5,963,070 A | * 10/1999 | Faulkner et al. | 327/174 |
| 6,175,535 B1 | * 1/2001 | Dhong et al. | 365/236 |

FOREIGN PATENT DOCUMENTS

JP 8-97793 4/1996

OTHER PUBLICATIONS

Japanese Office Action issued Apr. 25, 2006 in corresponding Japanese Patent Application No. 2002-12561.

* cited by examiner

*Primary Examiner*—Thomas Lee
*Assistant Examiner*—Sean Weinman
(74) *Attorney, Agent, or Firm*—Staas & Halsey, LLP

(57) ABSTRACT

A clock-signal generation device which changes an average frequency of a clock signal independently of a reference clock signal. A reference-clock-signal generation circuit generates a reference clock signal. A frequency-division circuit divides the frequency of the reference clock signal by using a natural number equal to or greater than one so as to generate a frequency-divided signal. A control circuit controls the frequency-division circuit so as to modify the frequency-divided signal by inserting extension cycles into the frequency-divided signal at predetermined intervals, and output the modified, frequency-divided signal as a clock signal. An output circuit outputs the clock signal generated by the control circuit. Therefore, the average frequency of the clock signal can be set arbitrarily and independently of the reference clock signal.

12 Claims, 15 Drawing Sheets

| NUMBER OF CYCLES IN GROUP \ NUMBER OF EXTENSION CYCLES | 1 | 2 | 3 | 4 |
|---|---|---|---|---|
| 1 | 0 | - | - | - |
| 2 | 0 | 0, 1 | - | - |
| 3 | 0 | 0, 1 | - | - |
| 4 | 0 | 0, 2 | 0, 1, 2 | 0, 1, 2, 3 |
| 5 | 0 | 0, 2 | 0, 1, 3 | 0, 1, 2, 3 |
| 6 | 0 | 0, 2 | 0, 2, 4 | 0, 1, 2, 4 |
| 7 | 0 | 0, 3 | 0, 2, 4 | 0, 1, 2, 4 |
| 8 | 0 | 0, 3 | 0, 2, 4 | 0, 1, 3, 5 |
| ... | ... | ... | ... | ... |
| 16 | 0 | 0, 8 | 0, 5, 10 | 0, 4, 8, 12 |

CLOCK-SIGNAL GENERATION DEVICE, COMMUNICATION DEVICE, AND SEMICONDUCTOR DEVICE

CROSS-REFERENCE TO RELATED APPLICATIONS

This application is based upon and claims priority of Japanese Patent Application No. 2002-126561, filed on Apr. 26, 2002, the contents being incorporated herein by reference.

BACKGROUND OF THE INVENTION

1) Field of the Invention

The present invention relates to a clock-signal generation device, a communication device, and a semiconductor device. In particular, the present invention relates to a clock-signal generation device which generates and outputs a clock signal, a communication device which transmits and receives data in synchronization with a clock signal, and a semiconductor device which operates based on a clock signal.

2) Description of the Related Art

FIG. 11 is a diagram illustrating a construction of a conventional serial communication device.

As illustrated in FIG. 11, the conventional serial communication device comprises a CPU (central processing unit) 10, a communication-clock generation unit 11, a CPU interface unit 12, a serial-to-parallel conversion unit 13, a parallel-to-serial conversion unit 14, and a transmission-and-reception unit 15.

The CPU 10 controls respective portions of the serial communication device based on programs and data stored in a storage device (not shown) or the like.

The communication-clock generation unit 11 generates a communication clock signal by dividing the frequency of a reference clock signal.

The CPU interface unit 12 converts a data representation format or the like when an operation of data exchange with the CPU 10 is performed.

The serial-to-parallel conversion unit 13 converts received data (serial data) to parallel data in synchronization with the communication clock signal, where the received data is supplied from the transmission-and-reception unit 15.

The parallel-to-serial conversion unit 14 converts transmission data (parallel data) to serial data in synchronization with the communication clock signal.

FIG. 12 is a diagram illustrating a detailed construction of the communication-clock generation unit 11.

As illustrated in FIG. 12, the communication-clock generation unit 11 comprises a subtraction circuit 20, a selector 21, a decision circuit 22, a counter 23, a register 24, a decision circuit 25, a decoder 26, a flip-flop circuit 27, and a selector 28.

The subtraction circuit 20 decrements the output of the counter 23 by one, and supplies the decremented output to the selector 21.

The selector 21 selects the output of the register 24 when the decision circuit 22 determines that the output of the counter 23 becomes "0," and the output of the subtraction circuit 20 in the other cases. The output selected by the selector 21 is supplied to the counter 23.

The decision circuit 22 determines whether or not the output of the counter 23 is "0." When the output of the counter 23 is "0," the decision circuit 22 makes the selector 21 select the output of the register 24. When the output of the counter 23 is not "0," the decision circuit 22 makes the selector 21 select the output of the subtraction circuit 20.

The counter 23 is a 4-bit counter constituted by four flip-flop circuits, and holds (latches) 4-bit data output from the selector 21 in synchronization with the reference clock signal.

The register 24 stores data for setting a frequency-division ratio.

The decision circuit 25 determines whether or not the data set in the register 24 is "0," i.e., whether or not a frequency-division ratio of "1" is designated. When the data set in the register 24 is "0," the decision circuit 25 makes the selector 28 select the reference clock signal so that the reference clock signal is output as it is. When the data set in the register 24 is not "0," the decision circuit 25 makes the selector 28 select the output of the flip-flop circuit 27.

The output of the decoder 26 becomes "H" or "L" according to the data output from the counter 23 so that the decoder 26 generates a clock signal having a predetermined duty ratio.

The flip-flop circuit 27 latches and outputs the output of the decoder 26 in synchronization with the reference clock signal.

The selector 28 selects the reference clock signal when it is determined that the data in the register 24 is "0." In the other cases, the selector 28 selects the output of the flip-flop circuit 27. The reference clock signal or the output of the flip-flop circuit 27 selected by the selector 28 is output as the communication clock signal.

Next, the operations of the above conventional serial communication device are explained.

When the serial communication device illustrated in FIG. 11 is powered on, the CPU 10 stores data designating a frequency-division ratio in the register 24 in the communication-clock generation unit 11 through the CPU interface unit 12. For example, in order to set a frequency-division ratio "4," data "3" is set in the register 24.

At this time, the counter 23 is in an initial state, and the output of the counter 23 is "0." Therefore, the register 24 makes the selector 21 select the output of the register 24. Thus, the data "3" stored in the register 24 is read out, and stored in the flip-flop circuits constituting the counter 23.

In the above situation, when the above reference clock signal becomes "H," the data "3" is read out from the counter 23 in synchronization with the leading edge of the "H" state, and supplied to the decoder 26.

The decoder 26 outputs "H" when the output of the counter 23 is "3" or "2," and "L" when the output of the counter 23 is "1" or "0." Since, in the above case, the output of the counter 23 is "3," the output of the decoder 26 becomes "H" in synchronization with the leading edge of the reference clock signal.

The flip-flop circuit 27 latches the output of the decoder 26 in synchronization with a leading edge of the reference clock signal. In this example, the flip-flop circuit 27 latches "H."

At this time, the decision circuit 25 makes the selector 28 select the output of the flip-flop circuit 27 since the data set in the register 24 is not "0." Resultantly, the selector 28 outputs the data ("H") latched in the flip-flop circuit 27.

The data output from the counter 23 is also supplied to the subtraction circuit 20, which decrements the data by one, and supplies the decremented data to the counter 23 through the selector 21. Since, in this case, the data output from the counter 23 is "3," the subtraction circuit 20 outputs "2,"

which is again stored in the counter 23, and output in synchronization with a leading edge of the reference clock signal.

The output of the counter 23 is input into the decoder 26. Since, in this example, the output of the counter 23 is "2," the output of the decoder 26 becomes "H." Therefore, the selector 28 still outputs "H."

Subsequently, when the subtraction circuit 20 outputs the data "1," this data is supplied through the counter 23 to the decoder 26 as in the above cases. Since the output of the counter 23 is "1," the output of the decoder 26 is changed to "L." Consequently, the selector 28 outputs "L."

Thereafter, when the subtraction circuit 20 outputs "0," the decoder 26 outputs "L." Therefore, the output of the selector 28 remains "H."

At this time, the decision circuit 22 determines that the output of the counter 23 becomes "0," and makes the selector 21 select the output of the register 24. Resultantly, the data "3" is again read into the counter 23 in synchronization with the next leading edge of the reference clock signal.

By repeating the above operations, it is possible to divide the frequency of the reference clock signal by a predetermined value, and generate a communication clock signal.

The communication clock signal generated as above is supplied to the serial-to-parallel conversion unit 13, the parallel-to-serial conversion unit 14, and the transmission-and-reception unit 15.

When the serial-to-parallel conversion unit 13, the parallel-to-serial conversion unit 14, and the transmission-and-reception unit 15 transmit and receive data, a predetermined number of pulses of the communication clock signal correspond to each bit of serial data. (Hereinafter, pulses of the communication clock signal are referred to as cycles.) For example, in the case where eight cycles correspond to one bit, each bit of serial data is transmitted or received while eight cycles of the communication clock signal are supplied.

The number of bits which can be transmitted and received in a unit time is generally called bit rate. When the period of the reference clock signal is denoted by M, and the frequency-division ratio is N, the period of the communication clock signal is M×N, and the period of each bit is M×N×8. At this time, the bit rate is 1/(M×N×8).

When the frequency of the reference clock signal is 4 MHz (=250 ns), and the frequency-division ratio is four, the number of bits which can be transmitted in a second is 125,000, and the bit rate is 125,000 bps.

FIG. 13 is a diagram indicating relationships between a reference clock signal, a communication clock signal, and transmission data in the case where the frequency-division ratio is four, and eight cycles correspond to one bit. In this example, one cycle of the communication clock signal indicated in FIG. 13, (B) is generated from every four cycles of the reference clock signal indicated in FIG. 13, (A), and every eight cycles of the communication clock signal corresponds to one bit as indicated in FIG. 13, (C).

Incidentally, in order to change the bit rate in the above conventional example, generally, the frequency-division ratio of the reference clock signal is changed. Although the operations in the case where the frequency-division ratio is set to four are indicated in FIG. 13, the operations become as indicated in FIG. 14 in the case where the frequency-division ratio is three. That is, one cycle of the communication clock signal indicated in FIG. 14, (B) is generated from every three cycles of the reference clock signal indicated in FIG. 14, (A), and every eight cycles of the communication clock signal corresponds to one bit as indicated in FIG. 14, (C).

In addition, FIG. 15 is a diagram indicating relationships in the case where the frequency-division ratio is set to five. In this example, one cycle of the communication clock signal indicated in FIG. 15, (B) is generated from every five cycles of the reference clock signal indicated in FIG. 15, (A), and every eight cycles of the communication clock signal corresponds to one bit as indicated in FIG. 15, (C).

The bit rate in the case where the frequency-division ratio is three is 1/(250 ns×3×8)=166,666 bps. On the other hand, the bit rate in the case where the frequency-division ratio is five is 1/(250 ns×5×8)=100,000 bps. In either case, the difference from the 125,000 bps is great.

As explained above, according to the method of controlling the bit rate by changing the frequency-division ratio, the bit rate cannot be changed by a small amount. For example, in order to obtain the bit rate of 120,000 bps, it is necessary to change the period of the reference clock signal per se.

However, if the period of the reference clock signal per se is changed for changing the bit rate, a malfunction can occur in the blocks other than the transmission-and-reception unit 15 since the reference clock signal is also supplied to the blocks other than the transmission-and-reception unit 15.

SUMMARY OF THE INVENTION

The present invention is made in view of the above problems, and the object of the present invention is to provide a clock-signal generation device, a communication device, and a semiconductor device which can generate from a single reference clock signal clock signals having various average frequencies.

In order to accomplish the above object, a clock-signal generation device which generates and outputs a clock signal is provided. The clock-signal generation device comprises: a reference-clock-signal generation circuit which generates a reference clock signal; a frequency-division circuit which divides the frequency of the reference clock signal by using a natural number equal to or greater than one so as to generate a frequency-divided signal; a control circuit which controls the frequency-division circuit so as to modify the frequency-divided signal by inserting extension cycles into the frequency-divided signal at predetermined intervals, and output the modified, frequency-divided signal as a clock signal; and an output circuit which outputs the clock signal generated by the control circuit.

In addition, in order to accomplish the above object, a communication device which transmits and receives data in synchronization with a clock signal is provided. The communication device comprises: a reference-clock-signal generation circuit which generates a reference clock signal; a frequency-division circuit which divides the frequency of the reference clock signal by using a natural number equal to or greater than one so as to generate a frequency-divided signal; a control circuit which controls the frequency-division circuit so as to modify the frequency-divided signal by inserting extension cycles into the frequency-divided signal at predetermined intervals, and output the modified, frequency-divided signal as a clock signal; and a transmission-and-reception circuit which transmits or receives data based on the clock signal generated by the control circuit.

Further, in order to accomplish the above object, a semiconductor device which operates based on a clock signal is provided. The semiconductor device comprises: a reference-clock-signal generation circuit which generates a reference clock signal; a frequency-division circuit which divides the frequency of the reference clock signal by using a natural number equal to or greater than one so as to generate a frequency-divided signal; a control circuit which controls the frequency-division circuit so as to modify the frequency-divided signal by inserting extension cycles into the frequency-divided signal at predetermined intervals, and output the modified, frequency-divided signal as a clock signal; and a supply circuit which supplies to a plurality of portions of the semiconductor device the clock signal generated by the control circuit.

The above and other objects, features and advantages of the present invention will become apparent from the following description when taken in conjunction with the accompanying drawings which illustrate preferred embodiment of the present invention by way of example.

BRIEF DESCRIPTION OF THE DRAWINGS

In the drawings:

FIG. 8 is a diagram indicating relationships between the number of cycles in each group, the number of one or more extension cycles, and one or more positions in which the extension cycles are to be inserted;

DESCRIPTION OF THE PREFERRED EMBODIMENTS

Embodiments of the present invention are explained below with reference to drawings.

Figure 1:
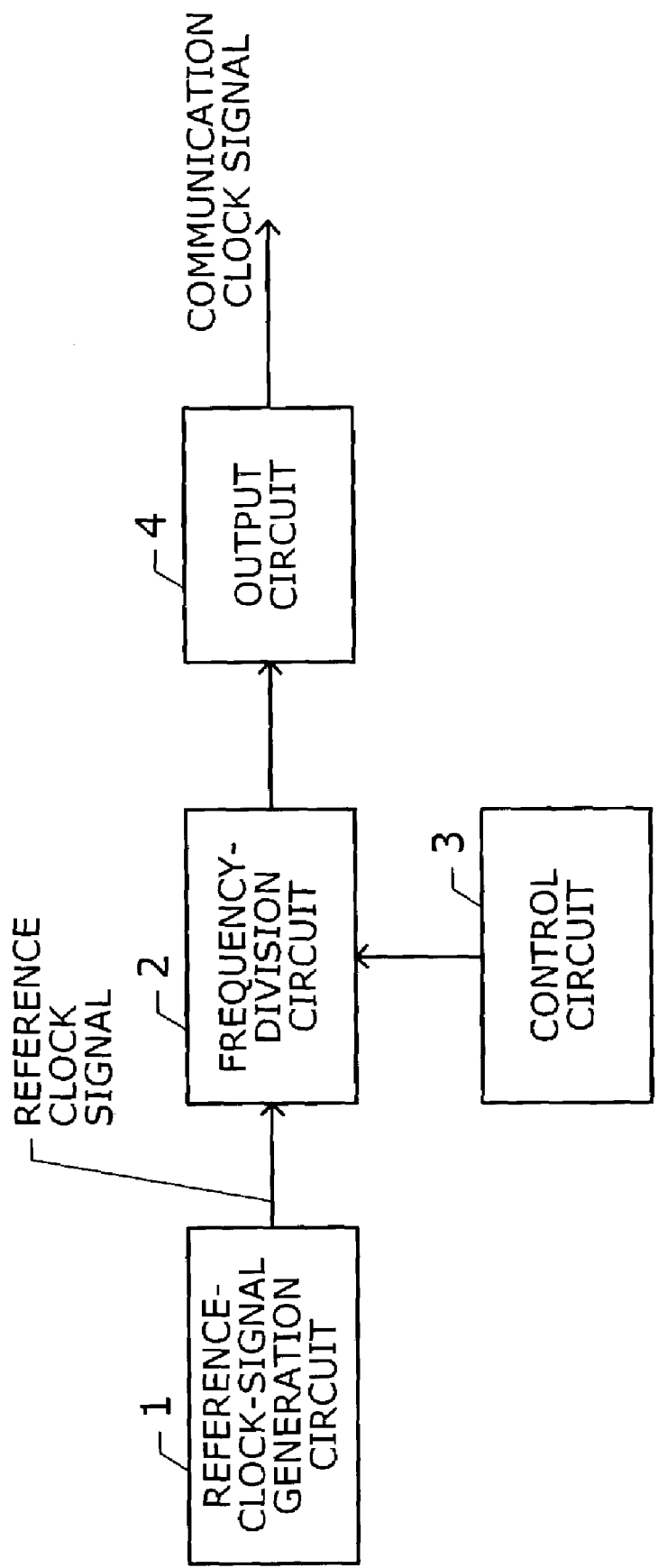
FIG. 1 is a diagram for explaining the principle of the present invention.

FIG. 1 is a diagram for explaining the principle of the present invention. As illustrated in FIG. 1, the clock-signal generation device according to the present invention comprises a reference-clock-signal generation circuit 1, a frequency-division circuit 2, a control circuit 3, and an output circuit 4.

The reference-clock-signal generation circuit 1 generates a reference clock signal based on which respective portions of the device operate.

The frequency-division circuit 2 divides the frequency of the above reference clock signal by a predetermined natural number n so as to generate a frequency-divided signal, where the predetermined natural number n is equal to or greater than one.

The control circuit 3 controls the frequency-division circuit 2 so as to modify the frequency-divided signal by inserting extension cycles into the frequency-divided signal at predetermined intervals, and output the modified, frequency-divided signal as a clock signal.

The output circuit 4 is constituted by, for example, a buffer or the like, and outputs the clock signal which is outputted from the frequency-division circuit 2. Alternatively, the frequency-division circuit 2 and the output circuit 4 may be integrated into a single circuit.

Next, the operations of the above construction are explained.

Figure 2:
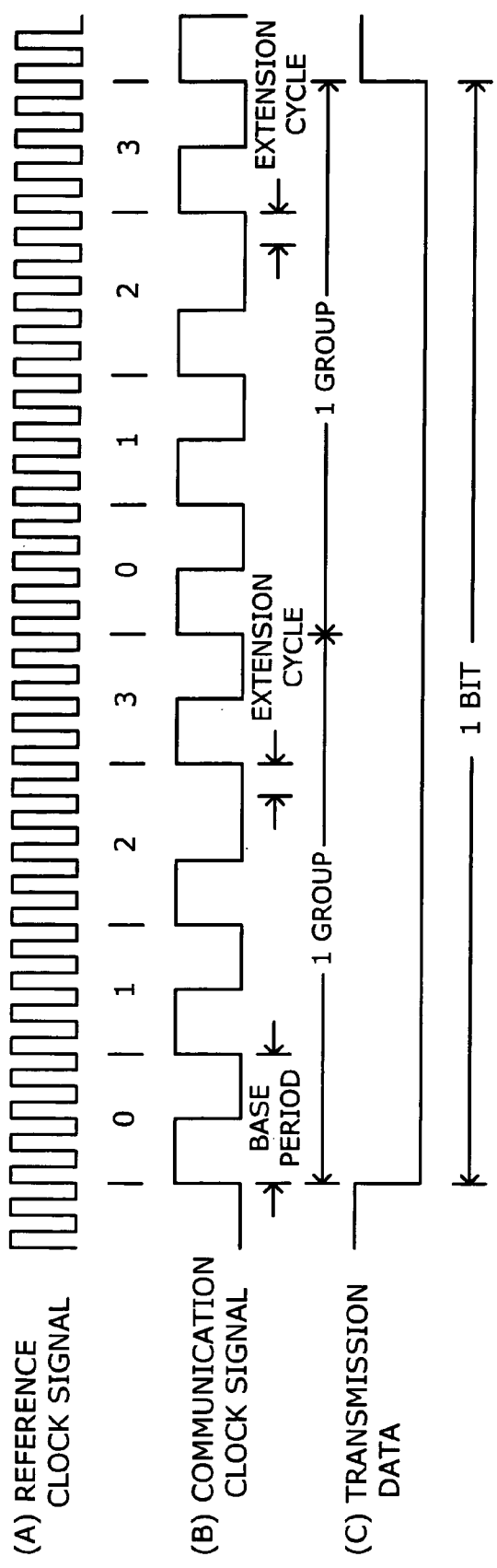
FIG. 2 is a diagram for explaining operations of the construction illustrated in FIG. 1.

The reference-clock-signal generation circuit 1 generates a reference clock signal as illustrated in FIG. 2, (A), and supplies the reference clock signal to the frequency-division circuit 2.

The frequency-division circuit 2 divides the frequency of the reference clock signal generated by the reference-clock-signal generation circuit 1. In the example of FIG. 2, the frequency-division circuit 2 generates a frequency-divided signal by dividing the frequency of the reference clock signal by four. That is, n=4.

In addition, when the frequency-division circuit 2 performs the operation of frequency division, the control circuit 3 deems every predetermined number of cycles of the frequency-divided signal to be a group, and controls the frequency-division circuit 2 so as to insert at least one extension cycle into every predetermined number of cycles constituting a group.

In the example of FIG. 2, as indicated in FIG. 2, (B), every four cycles of the frequency-divided signal are deemed to be a group, and an extension cycle is inserted into the 2nd cycle in each group. Specifically, the 0th, 1st, and 3rd cycles of each group are generated by simply dividing the frequency of the reference clock signal by four, and an extension cycle corresponding to one cycle of the reference clock signal is inserted into the phase in the 2nd cycle of each group in which the frequency-divided signal is "L."

The output circuit 4 outputs as a communication clock signal the modified, frequency-divided signal supplied from the frequency-division circuit 2, to a transmission-and-reception unit (not shown) and the like.

The transmission-and-reception unit (not shown) transmits and receives data, where each bit of the data is transmitted and received in eight cycles of the communication clock signal supplied from the output circuit 4.

Consequently, in the example of FIG. 2, the period of each bit becomes 250 ns×((4×4)+1×1)×2=8.5 μs, and the bit rate becomes 1 s÷8.5 μs=117,647 bps.

As explained above, an extension of a period in an arbitrary cycle according to the present invention can be considered to be a change of an average frequency-division ratio. According to the conventional method, when the period of the reference clock signal is denoted by M and the frequency-division ratio is denoted by N, the period of each bit becomes M×N×8 in the case where one-bit is transferred in every eight cycles, and the bit rate becomes 1+(M×N×8). On the other hand, according to the present invention, the average frequency-division ratio N' becomes N'=(X×N+Y× Z)+X, and the bit rate becomes 1+(M×((X×N+Y×Z)+X)×8), where N is the basic frequency-division ratio, X denotes the number of cycles in each group, Y denotes the number of one or more cycles extended in each group, and Z is the number of one or more periods of the reference clock signal for which an extension is made in each cycle (hereinafter referred to as the number of one or more extended reference periods). For example, the bit rate becomes 120,000 bps when the frequency of the reference clock signal is 4 MHz (corresponding to the period of 250 ns), the basic frequency-division ratio is four, the number of cycles in each group is six, the number of the cycle extended in each group is one, and the number of the extended reference period is one.

Although, in the above example, an extension cycle corresponding to one cycle of the reference clock signal is inserted, a longer extension cycle can be inserted.

In addition, although the extension cycle is inserted into the 2nd cycle, the extension cycle can be inserted into another cycle. Further, more than one extension cycle can be inserted.

As explained above, in the clock-signal generation device according to the present invention, an average frequency-division ratio of a communication clock signal can be changed without changing the reference clock signal. Therefore, the bit rate can be finely set, for example, corresponding to a remote party.

Next, an embodiment of the present invention is explained.

Figure 3:
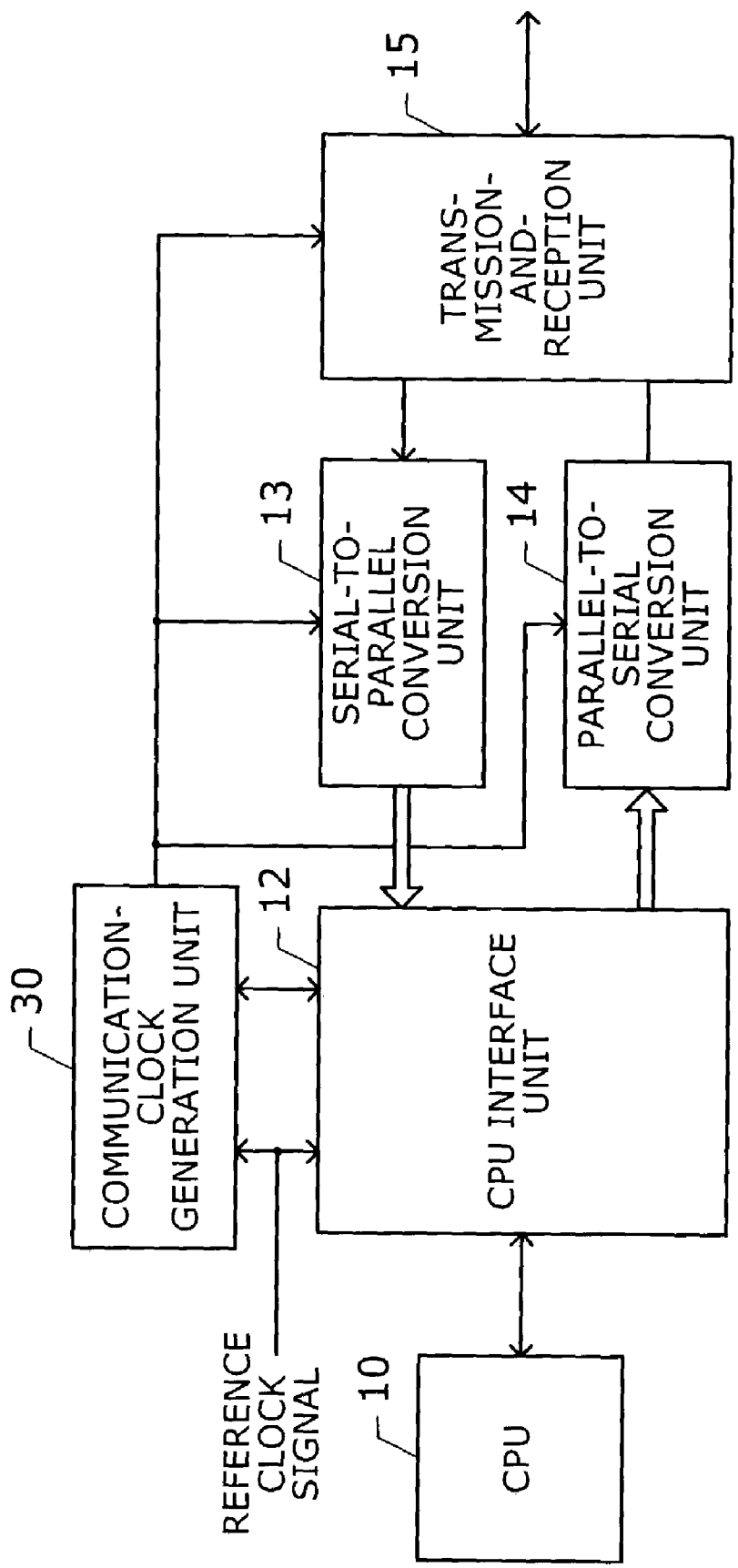
FIG. 3 is a diagram illustrating an exemplary construction of an embodiment of the present invention.

FIG. 3 is a diagram illustrating an exemplary construction of an embodiment of the present invention. As illustrated in FIG. 3, the embodiment of the present invention comprises a CPU 10, a communication-clock generation unit 30, a CPU interface unit 12, a serial-to-parallel conversion unit 13, a parallel-to-serial conversion unit 14, and a transmission-and-reception unit 15. The construction of FIG. 3 is identical to the conventional example of FIG. 11 except that the communication-clock generation unit 11 is replaced with the communication-clock generation unit 30.

The CPU 10 controls respective portions of the device based on programs and data stored in a storage device (not shown) or the like.

The communication-clock generation unit 30 generates a communication clock signal having a required frequency by dividing the frequency of a reference clock signal, and making insertions of extension cycles, as explained later. In addition, the communication-clock generation unit 30 supplies the generated communication clock signal to the respective portions of the device.

The CPU interface unit 12 converts a data representation format or the like when an operation of data exchange with the CPU 10 is performed.

The serial-to-parallel conversion unit 13 converts received data (serial data) to parallel data in synchronization with the communication clock signal, where the received data is supplied from the transmission-and-reception unit 15.

The parallel-to-serial conversion unit 14 converts transmission data (parallel data) to serial data in synchronization with the communication clock signal.

Figure 4:
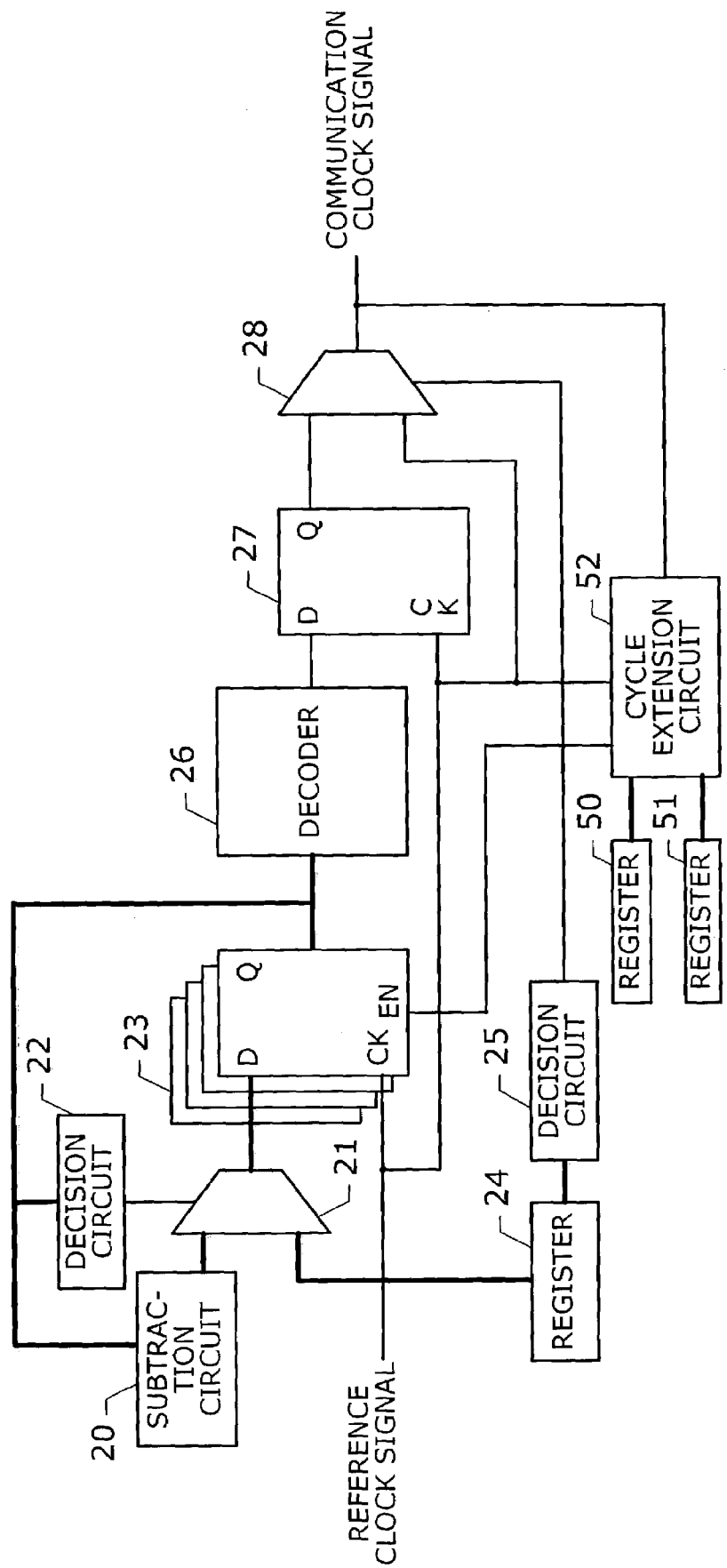
FIG. 4 is a diagram illustrating details of an exemplary construction of a communication-clock generation unit illustrated in FIG. 3.

FIG. 4 is a diagram illustrating details of the communication-clock generation unit 30 illustrated in FIG. 3.

As illustrated in FIG. 4, the communication-clock generation unit 30 comprises a subtraction circuit 20, a selector 21, a decision circuit 22, a counter 23, a register 24, a decision circuit 25, a decoder 26, a flip-flop circuit 27, a selector 28, registers 50 and 51, and a cycle extension circuit 52.

The subtraction circuit 20 decrements the output of the counter 23 by one, and supplies the decremented output to the selector 21.

The selector 21 selects the output of the register 24 when the decision circuit 22 determines that the output of the counter 23 becomes "0," and the output of the subtraction circuit 20 in the other cases. The output selected by the selector 21 is supplied to the counter 23.

The decision circuit 22 determines whether or not the output of the counter 23 is "0." When the output of the counter 23 is "0," the decision circuit 22 makes the selector 21 select the output of the register 24. When the output of the counter 23 is not "0," the decision circuit 22 makes the selector 21 select the output of the subtraction circuit 20.

The counter 23 is a 4-bit counter constituted by four flip-flop circuits, and holds (latches) 4-bit data output from the selector 21.

The register 24 stores data for setting a basic frequency-division ratio which determines a base period in the frequency division.

The decision circuit 25 determines whether or not the data set in the register 24 is "0," i.e., whether or not a frequency-division ratio of "1" is designated. When the data set in the register 24 is "0," the decision circuit 25 makes the selector 28 select the reference clock signal so that the reference clock signal is output as it is. When the data set in the register 24 is not "0," the decision circuit 25 makes the selector 28 select the output of the flip-flop circuit 27.

The output of the decoder 26 becomes "H" or "L" according to the data output from the counter 23 so that the decoder 26 generates a clock signal having a predetermined duty ratio.

The flip-flop circuit 27 latches and outputs the output of the decoder 26 in synchronization with the reference clock signal.

The selector 28 selects and outputs the reference clock signal when it is determined that the data in the register 24 is "0." In the other cases, the selector 28 selects and outputs the output of the flip-flop circuit 27.

The register 50 stores data designating the number of cycles constituting a group.

The register 51 stores data designating the number of one or more extended cycles and the number of one or more extended reference periods.

The cycle extension circuit 52 controls the counting operation in the counter 23 and performs processing for insertion of the extension cycles, based on the data stored in the registers 50 and 51.

Figure 5:
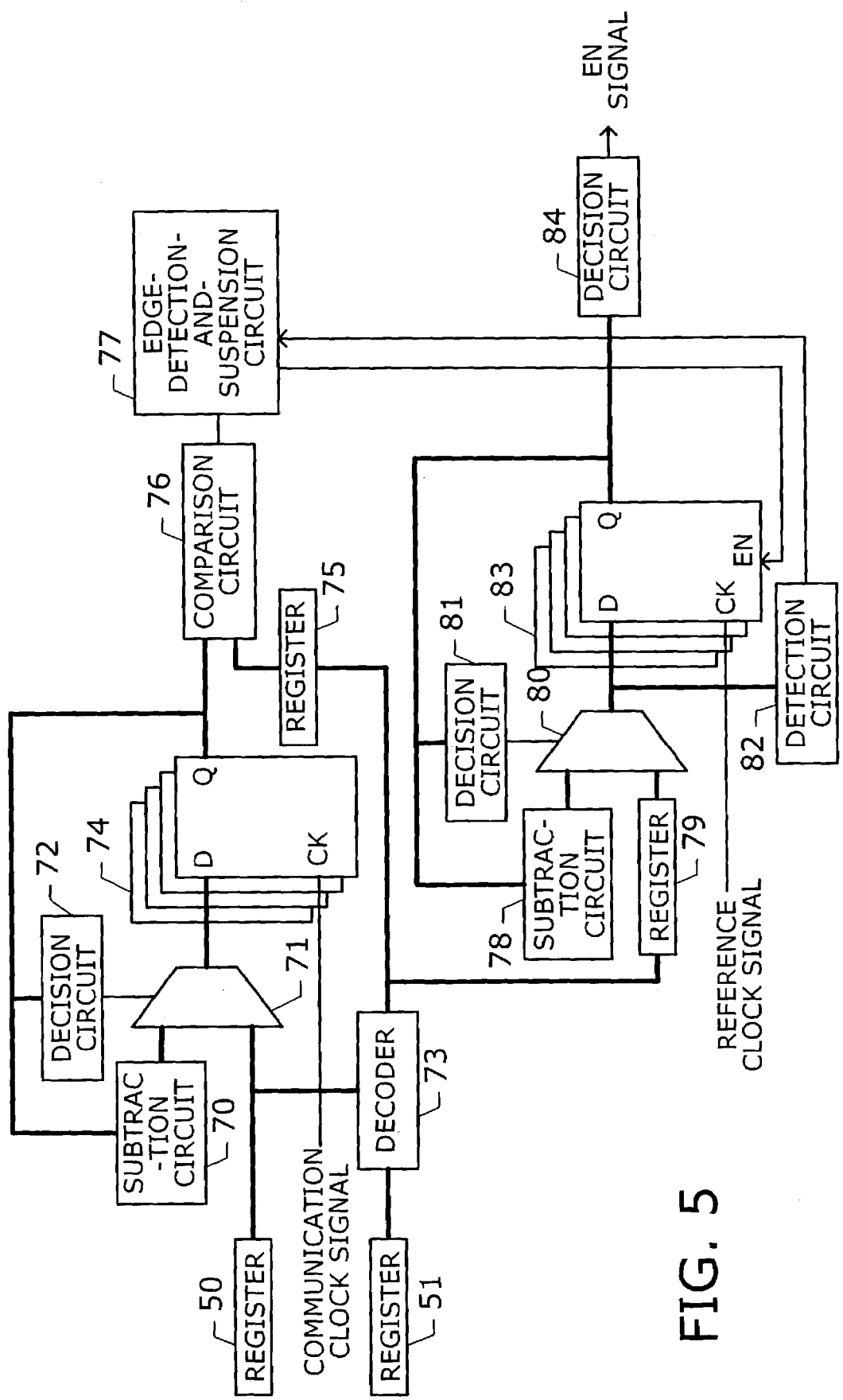
FIG. 5 is a diagram illustrating details of an exemplary construction of a cycle extension circuit illustrated in FIG. 4.

FIG. 5 is a diagram illustrating details of the cycle extension circuit 52. As illustrated in FIG. 5, the cycle extension circuit 52 comprises a subtraction circuit 70, a selector 71, a decision circuit 72, a decoder 73, a counter 74, a register 75, a comparison circuit 76, an edge-detection-and-suspension circuit 77, a subtraction circuit 78, a register 79, a selector 80, a decision circuit 81, a detection circuit 82, a counter 83, and a decision circuit 84.

The subtraction circuit 70 decrements the output of the counter 74 by one, and supplies the decremented output to the selector 71.

The selector 71 selects the output of the register 50 when the decision circuit 72 determines that the output of the counter 74 becomes "0," and the output of the subtraction circuit 70 in the other cases. The output selected by the selector 71 is supplied to the counter 74.

The decision circuit 72 determines whether or not the output of the counter 74 is "0." When the output of the counter 74 is "0," the decision circuit 72 makes the selector 71 select the output of the register 50. When the output of the counter 74 is not "0," the decision circuit 72 makes the selector 71 select the output of the subtraction circuit 70.

The decoder 73 decodes the data stored in the registers 50 and 51, and generates data to be stored in the registers 75 and 79.

The counter 74 is a 4-bit counter constituted by four flip-flop circuits, and holds (latches) 4-bit data output from the selector 71.

The register 75 stores a number indicating a cycle in which an extension cycle is to be inserted. This number is supplied from the decoder 73, and hereinafter referred to as an extension cycle number.

The comparison circuit 76 compares the data set in the register 75 with the data output from the counter 74, and supplies the comparison result to the edge-detection-and-suspension circuit 77.

The edge-detection-and-suspension circuit 77 starts the operation of the counter 83 when the comparison circuit 76 detects a cycle corresponding to the data set in the register 75, and suspends the operation of the counter 83 after expiration of a time corresponding to the number of one or more extended reference periods stored in the register 79.

The subtraction circuit 78 decrements the output of the counter 83 by one, and supplies the decremented output to the selector 80.

The register 79 stores data for setting the number of one or more extended reference periods.

The selector 80 selects the output of the register 79 when the decision circuit 81 determines that the output of the counter 83 becomes "0," and the output of the subtraction circuit 78 in the other cases. The output selected by the selector 80 is supplied to the counter 83.

The decision circuit 81 determines whether or not the output of the counter 83 is "0." When the output of the counter 83 is "0," the decision circuit 81 makes the selector 80 select the output of the register 79. When the output of the counter 83 is not "0," the decision circuit 81 makes the selector 80 select the output of the subtraction circuit 78.

The detection circuit 82 detects that the output of the selector 80 becomes "0" and notifies the edge-and-suspension circuit 77 of the output of the selector 80 in the "0" state.

The counter 83 is a 4-bit counter constituted by four flip-flop circuits, and holds 4-bit data output from the selector 80.

When the output of the counter 83 is not "0," the decision circuit 84 makes an enable (EN) signal active, where the enable (EN) signal is supplied to the counter 23 in FIG. 4. When the output of the counter 83 is "0," the decision circuit 84 makes the above enable (EN) signal inactive.

Next, the operations of the above embodiment are explained.

Figure 6:
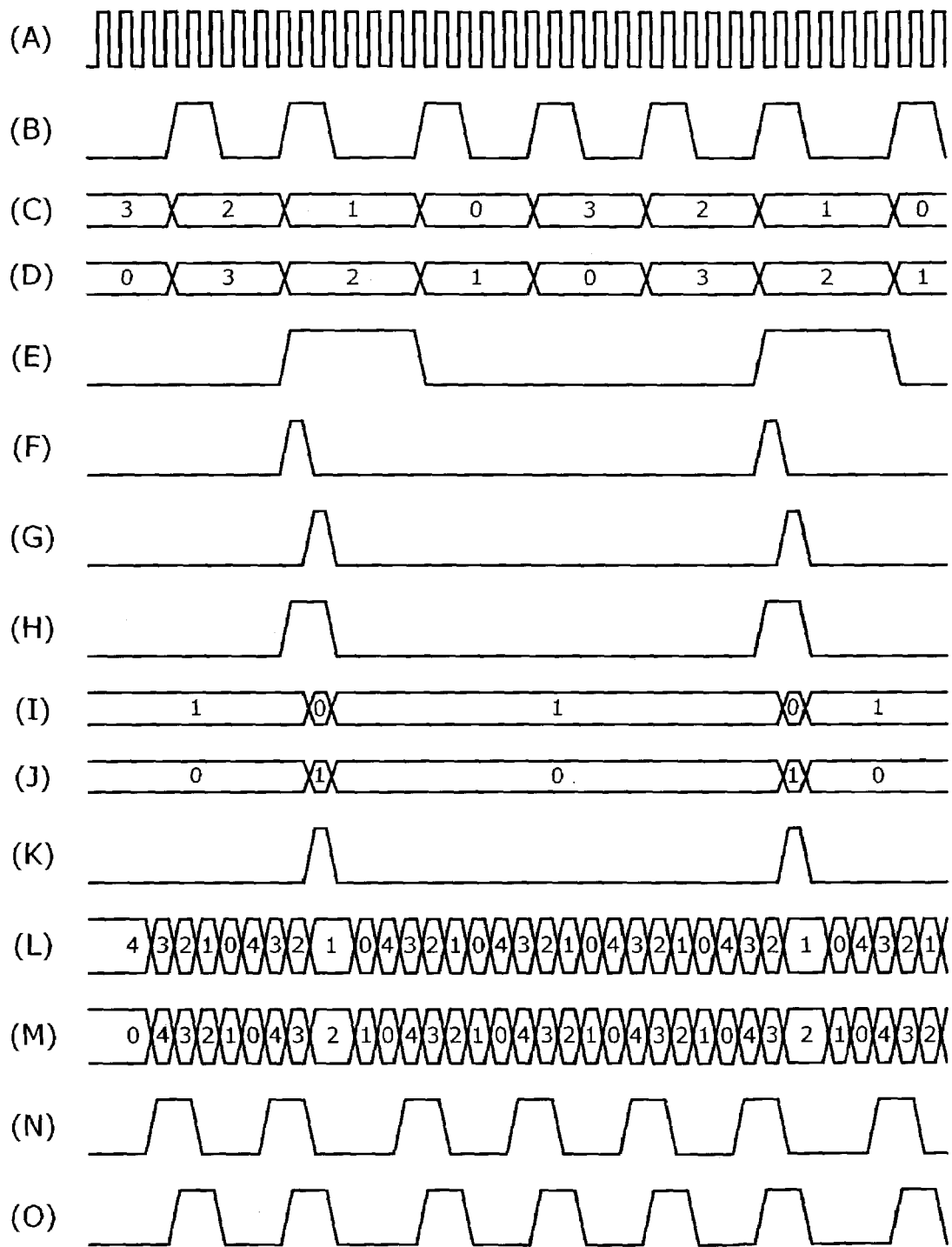
FIG. 6 is a timing diagram for explaining operations of the embodiment illustrated in FIGS. 3 to 5.

FIG. 6 is a timing diagram for explaining the operations of the embodiment illustrated in FIGS. 3 to 5. The following explanations are provided for an exemplary case where the basic frequency-division ratio is "5," the number of cycles in each group is "4," the extension cycle number is "2," and the number of one or more extended reference periods is "1." That is, "4" is set in the register 24, "3" is set in the register 50, and "2" and "1" are set in the register 51.

First, when the device illustrated in FIG. 3 is started up, the CPU 10 sets the aforementioned data in the registers 24, 50, and 51 in the communication-clock generation unit 30 through the CPU interface unit 12.

At this time, the counter 23 is in an initial state, and the output of the counter 23 is "0." Therefore, the decision circuit 22 makes the selector 21 select the output of the register 24. Thus, the data "4" stored in the register 24 is read out (see FIG. 6, (L)), and stored in the flip-flop circuits constituting the counter 23.

When the reference clock signal (see FIG. 6, (A)) becomes "H" in the above situation, the data "4" is read out (see FIG. 6, (M)) from the counter 23 in synchronization with the leading edge of the "H" state, and supplied to the decoder 26.

The decoder 26 outputs "H" when the output of the counter 23 is "4" or "3," and "L" when the output of the counter 23 is "2," "1," or "0." Since, in this case, the output of the counter 23 is "4," the output of the decoder 26 becomes "H" in synchronization with the leading edge of the reference clock signal (see FIG. 6, (N)).

The flip-flop circuit 27 latches the output of the decoder 26 in synchronization with a leading edge of the reference clock signal.

Since, at this time, the data set in the register 24 is not "0," the decision circuit 25 makes the selector 28 select the output of the flip-flop circuit 27. Thus, the selector 28 outputs the data "H" latched in the flip-flop circuit 27 (see FIG. 6, (O)).

The data output from the counter 23 is also supplied to the subtraction circuit 20, which decrements the supplied data by one, and supplies the decremented data to the counter 23 through the selector 21. Since, in this example, the data output from the counter 23 is "4," the subtraction circuit 20 outputs "3," which is again stored in the counter 23 and output in synchronization with a leading edge of the reference clock signal.

The output of the counter 23 is input into the decoder 26. Since, in this example, the output of the counter 23 is "3," the output of the decoder 26 becomes "H." Therefore, the output of the selector 28 remains "H."

Subsequently, when the subtraction circuit 20 outputs "2," this data is supplied through the counter 23 to the decoder 26 as in the aforementioned case. Since the output of the counter 23 is "2," the output of the decoder 26 is changed to "L." Thus, the selector 28 outputs "L." When the subtraction circuit 20 outputs "1," similar operations are performed.

Next, when the subtraction circuit 20 outputs "0," the decoder 26 outputs "L." Therefore, the selector 28 outputs "L."

At this time, the decision circuit 22 determines that the output of the counter 23 becomes "0," and makes the selector 21 select the output of the register 24. Thus, "4" is again read into the counter 23 in synchronization with the next leading edge of the reference clock signal.

The communication clock signal generated as above is supplied to the cycle extension circuit 52.

The subtraction circuit 70, the selector 71, the decision circuit 72, and the counter 74 in the cycle extension circuit 52 constitute a counter for counting the cycle number, which counts down from the data set in the register 50 in synchronization with the communication clock signal (see FIG. 6, (B) and (O)).

Since "3" is set in the register 50, "3" is input into the counter 74 at the time of startup, and the data read in is output with a delay corresponding to one cycle of the communication clock signal (see FIG. 6, (D)).

The comparison circuit 76 compares the data output from the counter 74 with the data set in the register 75. When the data output from the counter 74 coincides with the data set in the register 75, the comparison circuit 76 notifies the edge-detection-and-suspension circuit 77 of the coincidence.

Since, in this example, "2" is stored in the register 75, the output of the comparison circuit 76 becomes "H" as indicated in FIG. 6, (E) when "2" is output from the counter 74.

When the output of the comparison circuit 76 becomes "H," the edge-detection-and-suspension circuit 77 detects the leading edge of the output of the comparison circuit 76 (see FIG. 6, (F)), and makes the state of the signal which enables the operation of the counter 83 "H" (see FIG. 6, (H)).

Consequently, an extended period counter constituted by the subtraction circuit 78, the register 79, the selector 80, the decision circuit 81, and the counter 83 reads in the data stored in the register 79, and performs a countdown operation.

Since, in this example, "1" is stored in the register 79, when the operation of the counter 83 is enabled, "1" is read in from the register 79 (see FIG. 6, (I)), and a countdown operation is performed (see FIG. 6, (J)) in synchronization with the reference clock signal (see FIG. 6, (A)).

When the output of the selector 80 becomes "0," the detection circuit 82 detects the output "0," and notifies the edge-detection-and-suspension circuit 77 of the output of the selector 80 in the "0" state (see FIG. 6, (G)).

When the detection circuit 82 detects that the output of the selector 80 becomes "0," the edge-detection-and-suspension circuit 77 stops the operation of the counter 83.

Except when the output of the counter 83 is "0," the decision circuit 84 makes the state of the signal which suspends the operation of the counter 23 "H" (see FIG. 6, (K)). Consequently, the countdown operation of the counter 23 is suspended for a duration in which the counter 83 decrements its count by one, i.e., a duration corresponding to one cycle of the reference clock signal.

Resultantly, the cycle having the extension cycle number "2," in which the output of the decision circuit 84 becomes "H," is delayed for one cycle of the reference clock signal.

When the above operations are repeated, a communication clock signal in which the delayed cycle is included is generated.

Figure 7:
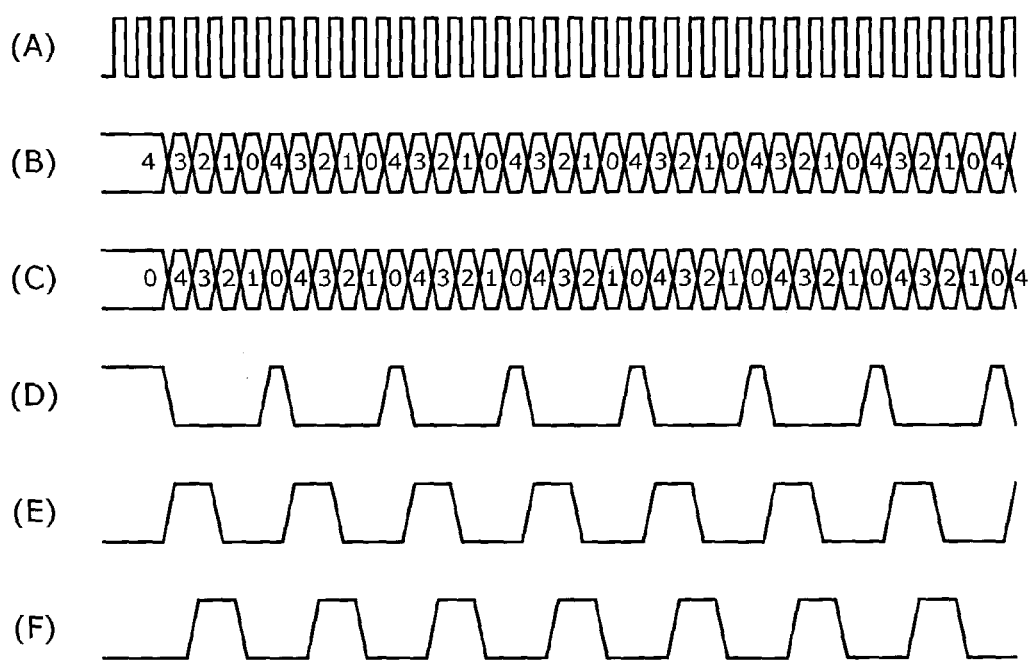
FIG. 7 is a diagram for explaining the operations of the conventional example.
Figure 11:
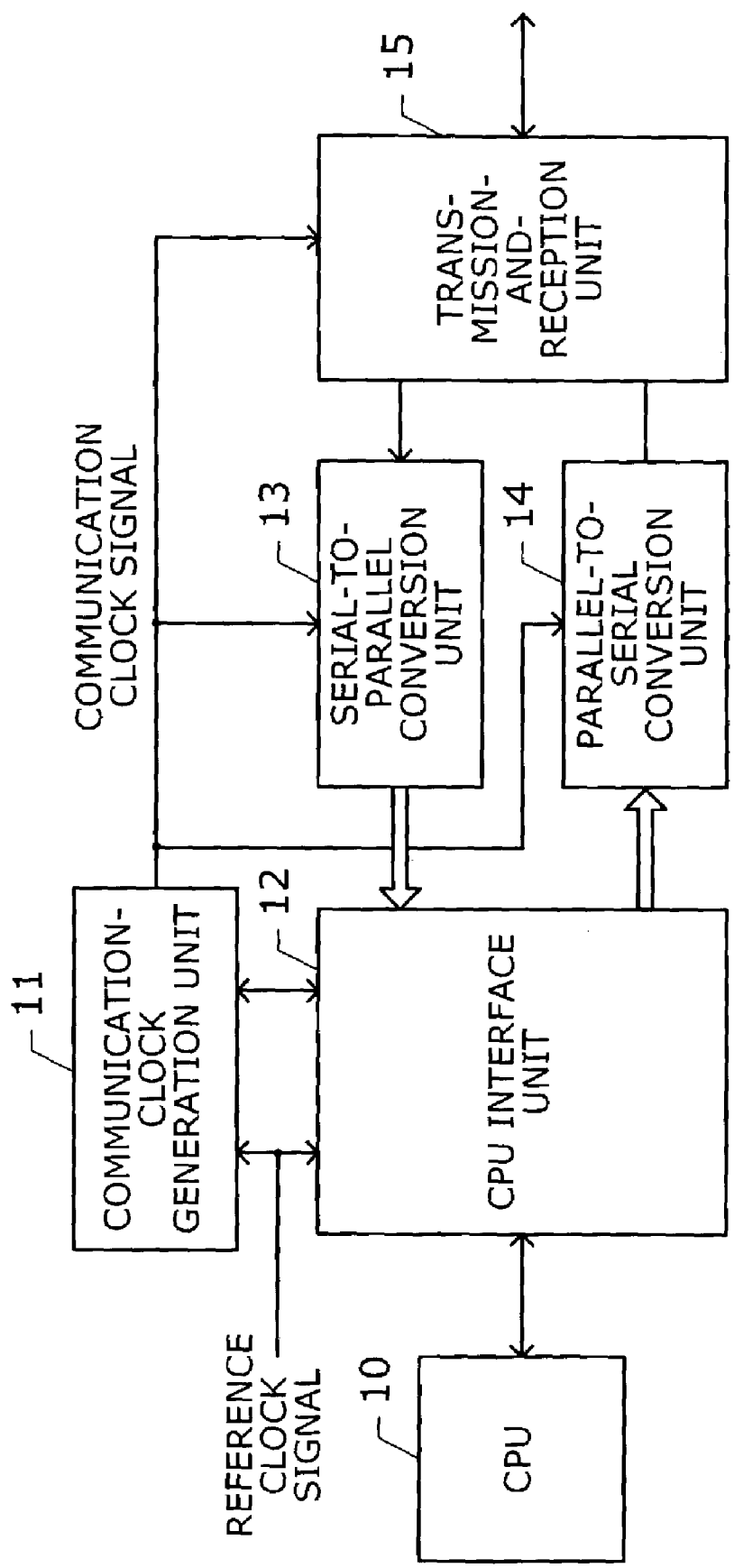
FIG. 11 is a diagram illustrating a construction of a conventional serial communication device.
Figure 12:
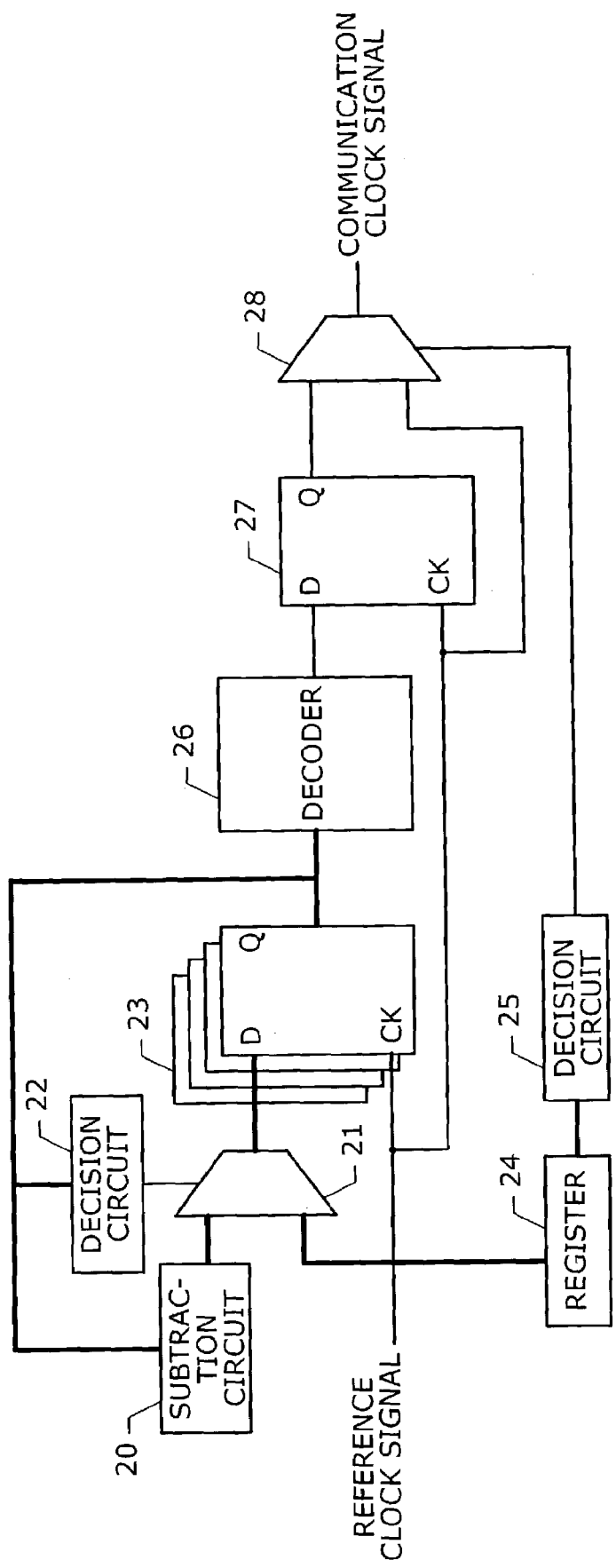
FIG. 12 is a diagram illustrating details of an exemplary construction of the communication-clock generation unit illustrated in FIG. 11.
Figure 13:
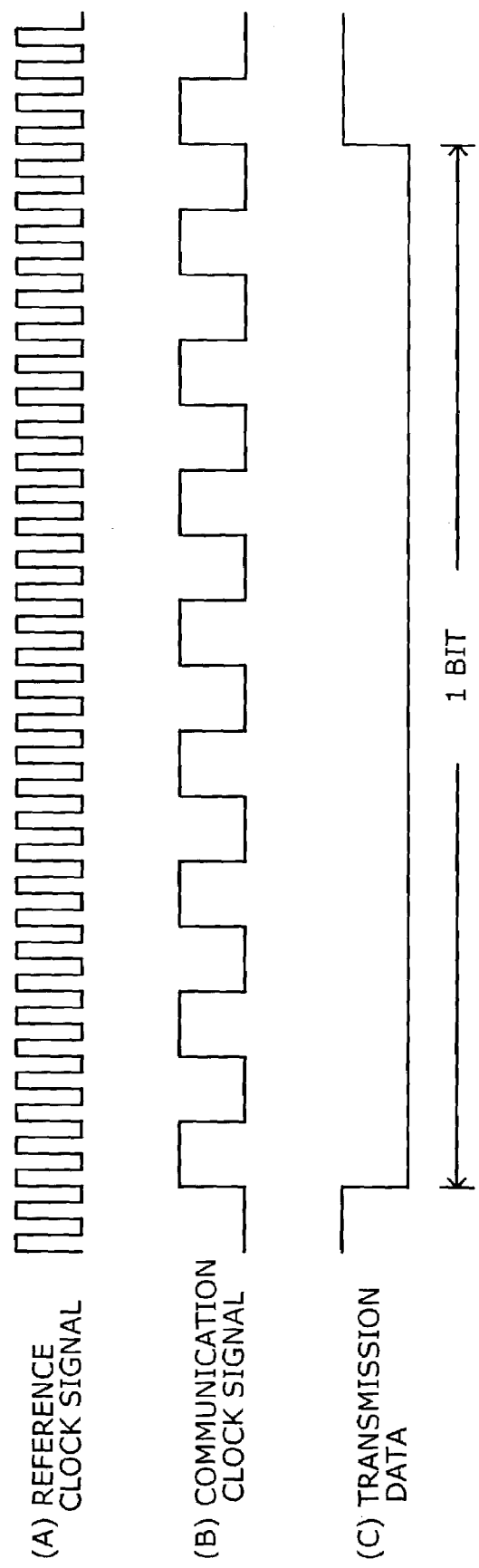
FIG. 13 is a timing diagram for explaining operations of the communication-clock generation unit illustrated in FIG. 11.
Figure 14:
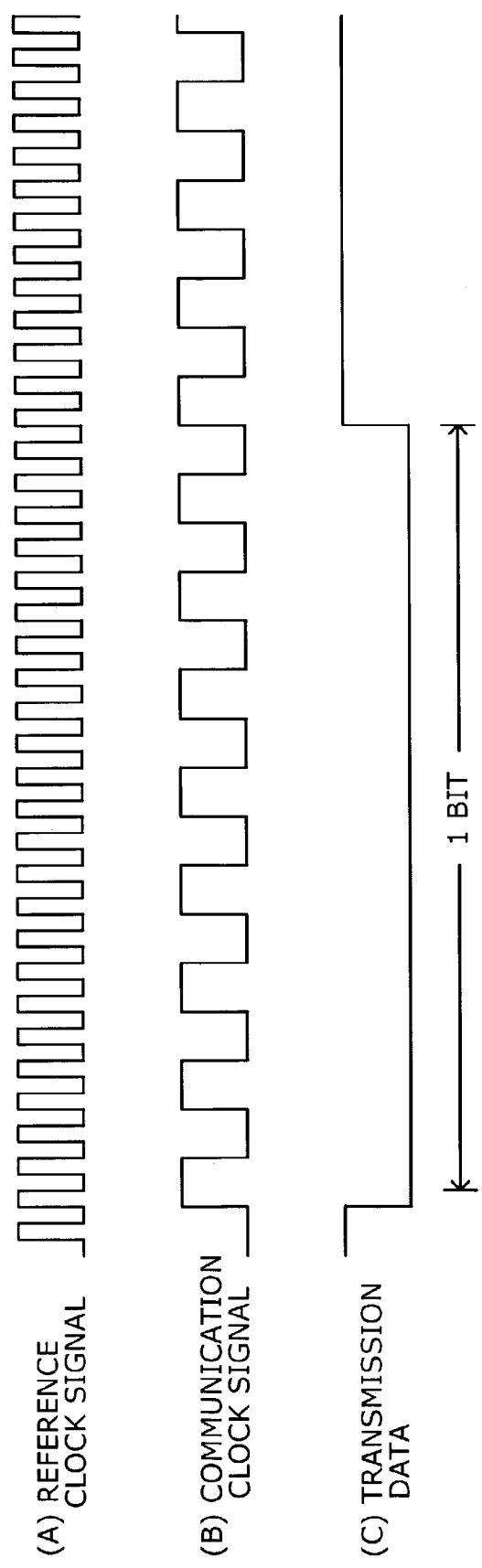
FIG. 14 is a timing diagram for explaining operations of the communication-clock generation unit illustrated in FIG. 11.
Figure 15:
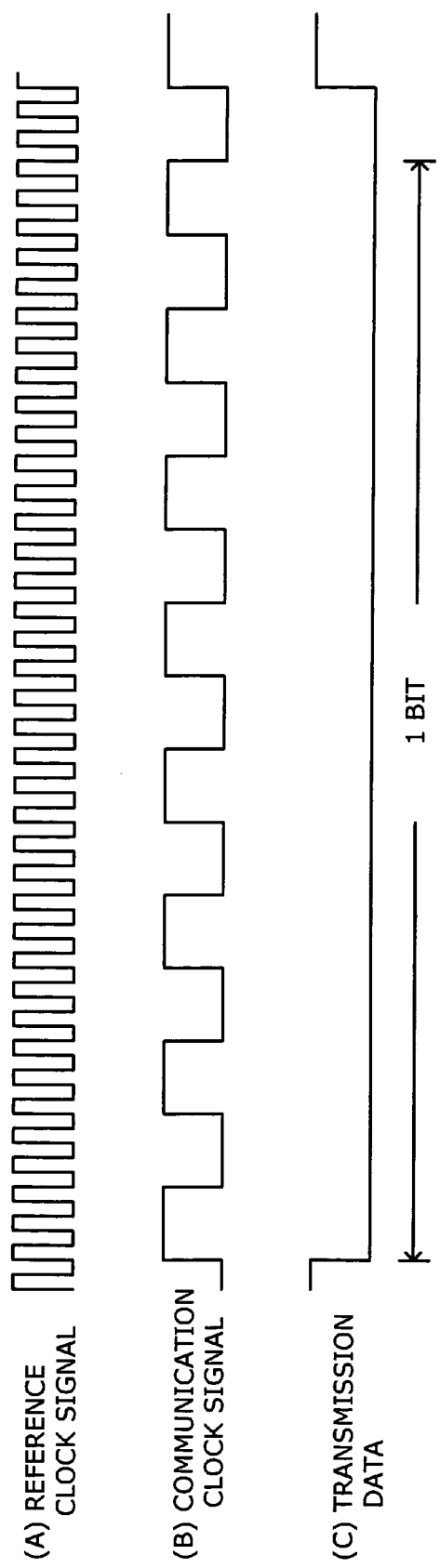
FIG. 15 is a timing diagram for explaining operations of the communication-clock generation unit illustrated in FIG. 11.

FIG. 7 is a timing diagram indicating operations of the conventional circuit illustrated in FIG. 11.

In FIG. 7, (A) is the reference clock signal, (B) is the input signal of the counter 23, (C) is the output signal of the counter 23, (D) is the output signal of the decision circuit 22, (E) is the output signal of the decoder 26, and (F) is the communication clock signal, which is the output of the selector 28. The signals (A) to (C) and (E) to (F) in FIG. 7 correspond to the signals (A) and (L) to (O) in FIG. 6, respectively.

The conventional example is compared with the embodiment of the present invention. In the conventional example indicated in FIG. 7, the periods of the input and output signals of the counter 23 are constant. On the other hand, in the embodiment of the present invention illustrated in FIG. 6, the counting operation is periodically suspended so that the period becomes irregular. That is, in the embodiment of the present invention, the average frequency of the communication clock signal is changed by periodically inserting an extension cycle. Therefore, the transmission rate (bit rate) can be changed while the reference clock signal is maintained constant.

Although, in the example explained above, only one extension cycle is inserted in the second cycle, the extension cycle can be inserted in other cycles. In addition, more than one extension cycle can be inserted.

FIG. 8 is a diagram indicating relationships between the number of cycles in each group, the number of one or more extension cycles, and one or more positions in which the extension cycles are to be inserted. In FIG. 8, each row under the label "NUMBER OF CYCLES IN GROUP" corresponds to the number of one or more cycles in a group, and each column under the label "NUMBER OF EXTENSION CYCLES" corresponds to the number of one or more extension cycles in a group.

For example, when the number of cycles in each group is "4" and the number of the extension cycle is "1", "0" is indicated in the corresponding field in the table. Therefore, an extension cycle is inserted in the 0th cycle. Alternatively, when the number of cycles in each group is "4" and the number of the extension cycles is "2", "0, 2" is indicated in the corresponding field in the table. Therefore, an extension cycle is inserted in each of the 0th and 2nd cycles.

The above table is stored in advance in a storage device (for example, a ROM or the like) which the CPU 10 can access. It is possible to read out appropriate data from the above storage device and store the data in the registers 50 and 51 when the device as the embodiment is started up. In this case, the device as the embodiment derives a position in which an extension cycle is to be inserted, from the values stored in the registers 50 and 51, and performs the operation.

Although, in the above embodiment, the CPU 10 changes the transmission rate when the device is started up (powered on), it is possible to dynamically change the transmission rate when a peripheral device as a remote party is newly connected, or when a communication condition is changed.

In an example of a practicable method for changing a transmission rate when a peripheral device is connected, the CPU 10 monitors conditions of connections of peripheral devices, identifies the type of a peripheral device when connection of the peripheral device is newly detected, and sets a communication clock signal so as to realize an appropriate transmission rate.

In addition, in an example of a practicable method for changing a transmission rate when a communication condition is changed, the CPU 10 monitors the communication condition (e.g., an amount of data transmitted in a unit time), and changes the communication clock signal according to the monitoring result.

Figure 9:
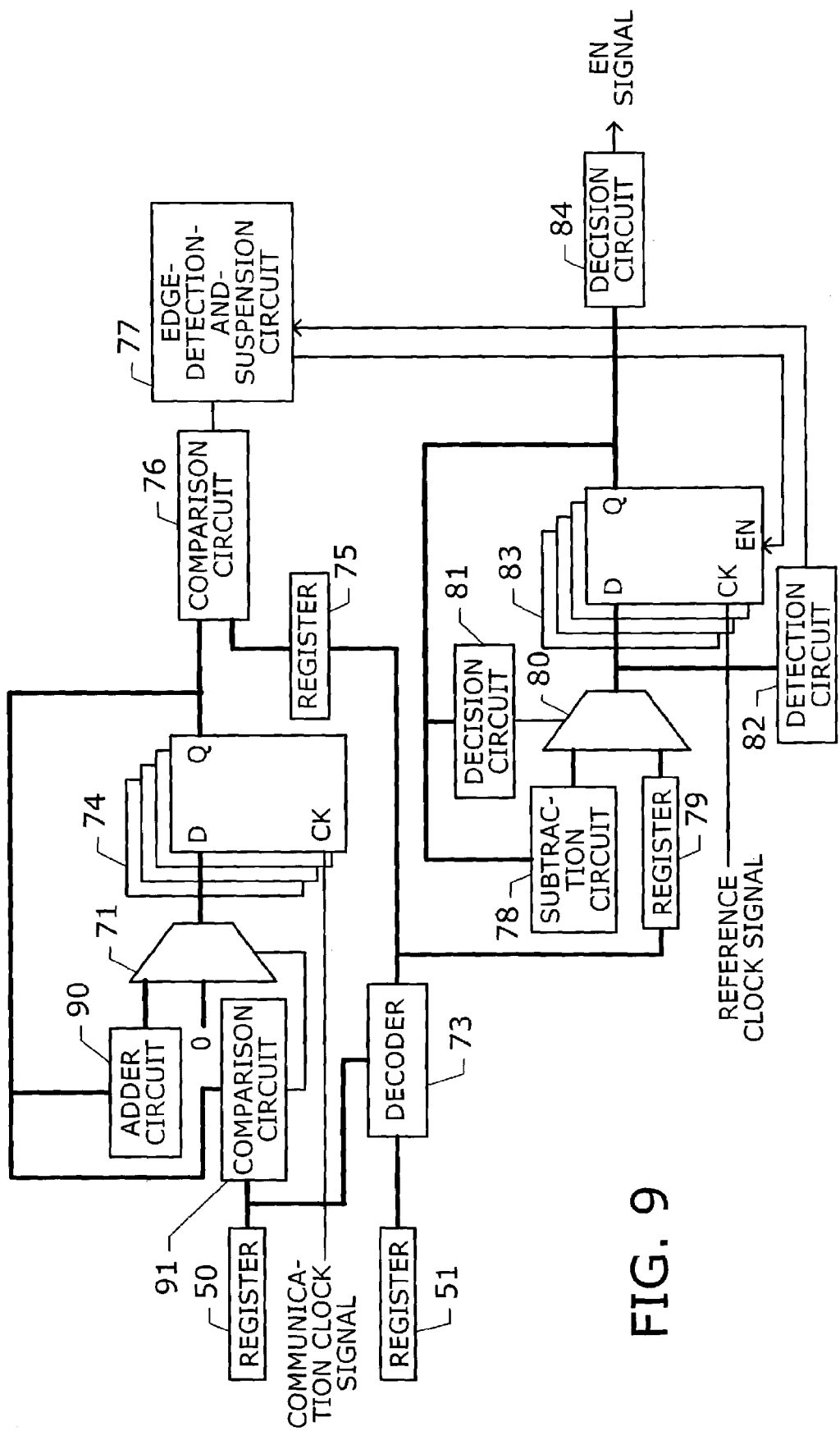
FIG. 9 is a diagram illustrating details of another exemplary construction of the cycle extension circuit illustrated in FIG. 4.

Next, another example of the construction of the cycle extension circuit 52 in FIG. 4 is explained. FIG. 9 is a diagram illustrating details of another example of the construction of the cycle extension circuit 52 in FIG. 4. In FIG. 9, the same elements as FIG. 5 respectively bear the same reference numerals as FIG. 5, and the explanations of the same elements as FIG. 5 are not repeated.

The construction of FIG. 9 is identical to the construction of FIG. 5 except that the subtraction circuit 70 and the decision circuit 72 in FIG. 5 are replaced with the adder circuit 90 and the comparison circuit 91 in FIG. 9, respectively. In addition, 4-bit data "0" is input into the selector 71.

The adder circuit 90 increments the data output from the counter 74 by one, and supplies the incremented data to the selector 71.

The comparison circuit 91 compares the data stored in the register 50 with the data output from the counter 74. When these data coincide, the comparison circuit 91 makes the selector 71 select the data "0." When these data do not coincide, the comparison circuit 91 makes the selector 71 select the output of the adder circuit 90.

Figure 10:
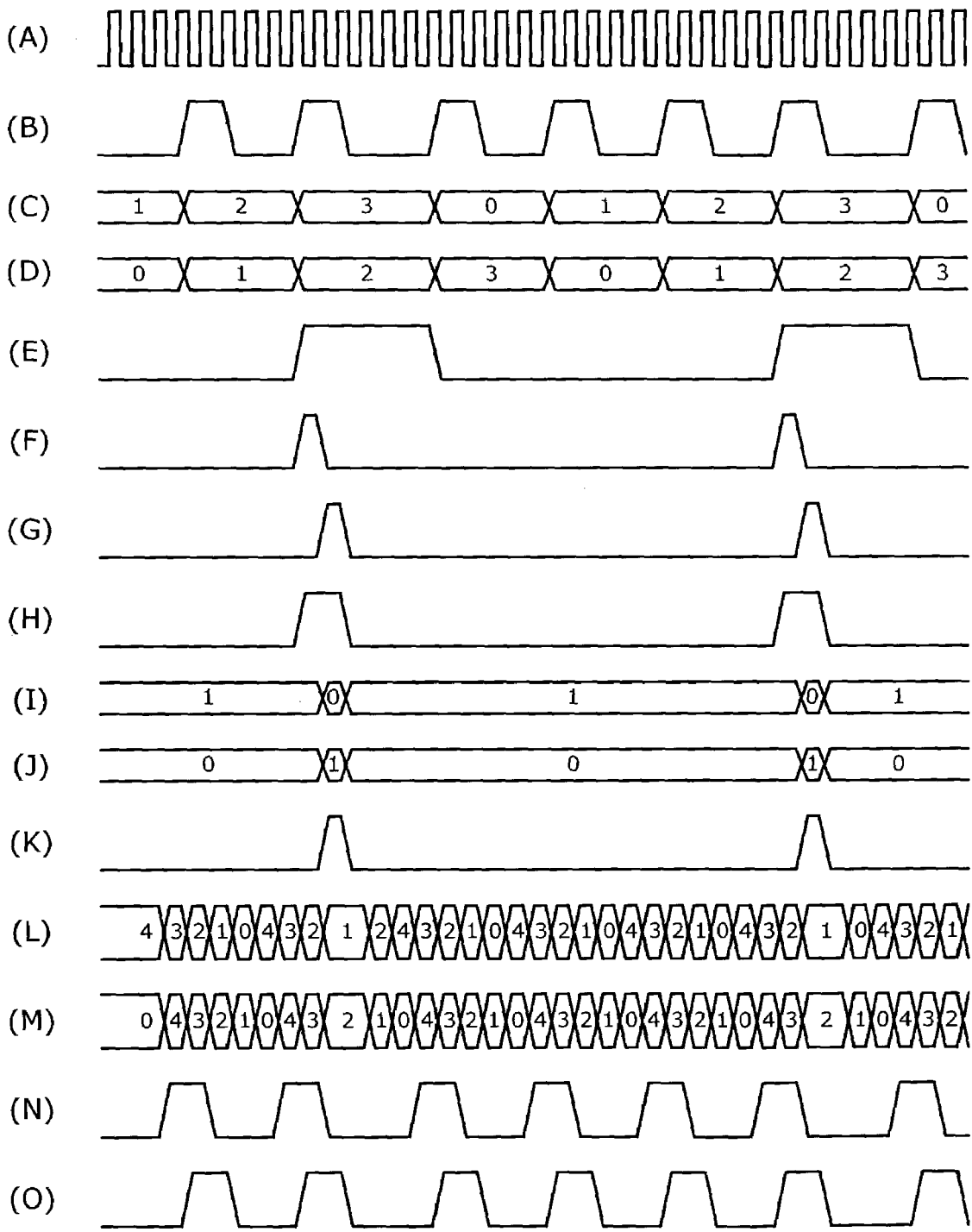
FIG. 10 is a timing diagram for explaining operations of an embodiment illustrated in FIGS. 3, 4, and 9.

Next, operations of the above construction of FIG. 9 are explained. FIG. 10 is a timing diagram for explaining the operations of the embodiment illustrated in FIG. 9. The following explanations are provided for an exemplary case where the basic frequency-division ratio is "5," the number of one or more extension cycles in a group is "4," the extension cycle number is "2," and the number of one or more extended reference periods is "1." That is, "4" is set in the register 24, "3" is set in the register 50, and "2" and "1" are set in the register 51.

First, when the device illustrated in FIG. 3 is started up, the CPU 10 sets the aforementioned data in the registers 24, 50, and 51 in the communication-clock generation unit 30 through the CPU interface unit 12.

At this time, the counter 23 is in an initial state, and the output of the counter 23 is "0." Therefore, the decision circuit 22 makes the selector 21 select the output of the register 24. Thus, the data "4" stored in the register 24 is read out (see FIG. 10, (L)), and stored in the flip-flop circuits constituting the counter 23.

When the reference clock signal (see FIG. 10, (A)) becomes "H" in the above situation, the data "4" is read out (see FIG. 10, (M)) from the counter 23 in synchronization with the leading edge of the "H" state, and supplied to the decoder 26.

As in the construction of FIG. 5, the decoder 26 outputs "H" when the output of the counter 23 is "4" or "3," and "L" when the output of the counter 23 is "2,""1," or "0." Since, in this case, the output of the counter 23 is "4," the output of the decoder 26 becomes "H" in synchronization with the leading edge of the reference clock signal (see FIG. 10, (N)).

The flip-flop circuit 27 latches the output of the decoder 26 in synchronization with a leading edge of the reference clock signal.

Since, at this time, the data set in the register 24 is not "0," the decision circuit 25 makes the selector 28 select the output of the flip-flop circuit 27. Thus, the selector 28 outputs the data "H" latched in the flip-flop circuit 27 (see FIG. 10, (O)).

The data output from the counter 23 is also supplied to the subtraction circuit 20, which decrements the supplied data by one, and supplies the decremented data to the counter 23 through the selector 21. Since, in this example, the data output from the counter 23 is "4," the subtraction circuit 20 outputs "3," which is again stored in the counter 23 and output in synchronization with a leading edge of the reference clock signal.

The output of the counter 23 is input into the decoder 26. Since, in this example, the output of the counter 23 is "3," the output of the decoder 26 becomes "H." Therefore, the output of the selector 28 remains "H."

Subsequently, when the subtraction circuit 20 outputs "2," this data is supplied through the counter 23 to the decoder 26 as in the aforementioned case. Since the output of the counter 23 is "2," the output of the decoder 26 is changed to "L." Thus, the selector 28 outputs "L." When the subtraction circuit 20 outputs "1," similar operations are performed.

Next, when the subtraction circuit 20 outputs "0," the decoder 26 outputs "L." Therefore, the selector 28 outputs "L."

At this time, the decision circuit 22 determines that the output of the counter 23 becomes "0," and makes the selector 21 select the output of the register 24. Thus, "4" is again read into the counter 23 in synchronization with the next leading edge of the reference clock signal.

The communication clock signal generated as above is supplied to the cycle extension circuit 52.

The adder circuit 90, the selector 71, the comparison circuit 91, and the counter 74 in the cycle extension circuit 52 constitute a counter for counting the cycle number, which counts up to the data set in the register 50 in synchronization with the communication clock signal (see FIG. 10, (B) and (O)). When the count reaches the data set in the register 50, the count is reset to "0," and the counting operation is repeated.

Since the comparison circuit 91 makes the selector 71 select "0" at the time of startup, "0" is input into the counter 74 as indicated in FIG. 10, (C), and the data read in is output with a delay corresponding to one cycle of the communication clock signal (see FIG. 10, (D)).

The comparison circuit 76 compares the data output from the counter 74 with the data set in the register 75. When the data output from the counter 74 coincides with the data set in the register 75, the comparison circuit 76 notifies the edge-detection-and-suspension circuit 77 of the coincidence.

Since, in this example, "2" is stored in the register 75, the output of the comparison circuit 76 becomes "H" as indicated in FIG. 10, (E) when "2" is output from the counter 74.

When the output of the comparison circuit 76 becomes "H," the edge-detection-and-suspension circuit 77 detects the leading edge of the output of the comparison circuit 76 (see FIG. 10, (F)), and makes the state of the signal which enables the operation of the counter 83 "H" (see FIG. 10, (H)).

Consequently, an extended period counter constituted by the subtraction circuit 78, the register 79, the selector 80, the decision circuit 81, and the counter 83 reads in the data stored in the register 79, and performs a countdown operation.

Since, in this example, "1" is stored in the register 79, when the operation of the counter 83 is enabled, "1" is read in from the register 79 (see FIG. 10, (I)), and a countdown operation is performed (see FIG. 10, (J)) in synchronization with the reference clock signal (see FIG. 10, (A)).

When the output of the selector 80 becomes "0," the detection circuit 82 detects the output "0," and notifies the edge-detection-and-suspension circuit 77 of the output of the selector 80 in the "0" state (see FIG. 10, (G)).

When the detection circuit 82 detects that the output of the selector 80 becomes "0," the edge-detection-and-suspension circuit 77 stops the operation of the counter 83.

Except when the output of the counter 83 is "0," the decision circuit 84 makes the state of the signal which suspends the operation of the counter 23 "H" (see FIG. 10, (K)). Consequently, the countdown operation of the counter 23 is suspended for a duration in which the counter 83 decrements its count by one, i.e., a duration corresponding to one cycle of the reference clock signal.

Resultantly, the cycle having the extension cycle number "2," in which the output of the decision circuit 84 becomes "H," is delayed for one cycle of the reference clock signal.

When the above operations are repeated, a communication clock signal in which the delayed cycle is included is generated.

Although the present invention is applied to a serial communication device in the above embodiment, the present invention is not limited to such a case, and can also be applied to various other fields.

For example, a clock signal to be supplied to a peripheral device can be generated by the clock-signal generation device according to the present invention. In this case, it is possible to reduce power consumption by setting the average period of the clock signal small when the frequency of use of the peripheral device is low.

As explained above, in the clock-signal generation device according to the present invention, the control circuit controls the frequency-division circuit so as to insert an extension cycle as necessary. Therefore, it is possible to easily change the average frequency of the clock signal without change of the reference clock signal.

In addition, in the communication device according to the present invention, the control circuit controls the frequency-division circuit so as to insert an extension cycle as necessary. Therefore, it is possible to easily change the average frequency of the clock signal without change of the reference clock signal. Thus, the period of the clock signal can be changed according to a communication condition so that optimum communication can be realized.

Further, in the semiconductor device according to the present invention, the control circuit controls the frequency-division circuit so as to insert an extension cycle as necessary. Therefore, it is possible to easily change the average frequency of the clock signal without change of the reference clock signal. Thus, a clock signal having an optimum frequency can be supplied according to operational conditions of various portions of the semiconductor device.

The foregoing is considered as illustrative only of the principle of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A clock-signal generation device for generating and outputting a clock signal, comprising:
    a reference-clock-signal generation circuit which generates a reference clock signal having a frequency;
    a frequency-division circuit which divides the frequency of the reference clock signal by using a natural number equal to or greater than one so as to generate a frequency-divided signal;
    a control circuit which controls the frequency-division circuit so as to modify the frequency-divided signal by inserting extension cycles into the frequency-divided signal at predetermined intervals, and output a modified, frequency-divided signal as the clock signal;
    an output circuit which outputs the clock signal generated by the control circuit,
    wherein the frequency-division circuit counts the reference-clock-signal by using a first counter outputting a count value, and divides the frequency of the reference-clock-signal by making an output signal of the frequency-division circuit "H" or "L" according to the count value of the first counter, and
    the control circuit inserts the extension cycles into the frequency-divided signal by temporarily suspending an operation of the first counter.

2. The clock-signal generation device according to claim 1, wherein the control circuit comprises a second counter outputting a count value for obtaining a time at which the first counter is to be suspended, and determines lengths of the extension cycles according to the count value of the second counter.

3. The clock-signal generation device according to claim 1, wherein the control circuit defines every predetermined number of cycles of the frequency-divided signal as a group, and inserts at least one extension cycle in at least one predetermined position of the group.

4. The clock-signal generation device according to claim 3, wherein the control circuit inserts more than one extension cycle in more than one predetermined position of the group.

5. The clock-signal generation device according to claim 4, wherein the control circuit comprises a table indicating relationships between the number of cycles constituting each group, the number of one or more extension cycles to be inserted, and at least one insertion position, and the control circuit inserts the at least one extension cycle in the at least one predetermined position based on the table.

6. The clock-signal generation device according to claim 1, wherein the control circuit determines the number of the extension cycles which are to be inserted and insertion positions in which the extension cycles are to be inserted, when a system is started up.

7. The clock-signal generation device according to claim 1, wherein the control circuit changes the number of the extension cycles which are to be inserted and insertion positions in which the extension cycles are to be inserted, when an operational condition of the clock-signal generation device changes.

8. A communication device for transmitting and receiving data in synchronization with a clock signal, comprising:
    a reference-clock-signal generation circuit which generates a reference clock signal;
    a frequency-division circuit which divides the frequency of the reference clock signal by using a natural number equal to or greater than one so as to generate a frequency-divided signal;
    a control circuit which controls the frequency-division circuit so as to modify the frequency-divided signal by inserting extension cycles into the frequency-divided signal at predetermined intervals, and output a modified, frequency-divided signal as the clock signal;
    a transmission-and-reception circuit which transmits or receives data based on the clock signal generated by the control circuit,
    wherein the frequency-division circuit counts the reference-clock-signal by using a first counter outputting a count value, and divides the frequency of the reference-clock-signal by making an output signal of the frequency-division circuit "H" or "L" according to the count value of the first counter, and
    the control circuit inserts the extension cycles into the frequency-divided signal by temporarily suspending an operation of the first counter.

9. The communication device according to claim 8, wherein the control circuit determines the number of the extension cycles which are to be inserted and insertion positions in which the extension cycles are to be inserted, when the communication device is started up.

10. The communication device according to claim 8, wherein the control circuit changes the number of the extension cycles which are to be inserted and insertion positions in which the extension cycles are to be inserted, when a communication situation changes.

11. The communication device according to claim 8, wherein the control circuit changes the number of the extension cycles which are to be inserted and insertion positions in which the extension cycles are to be inserted, when remote parties increase or decrease.

12. A semiconductor device which operates based on a clock signal, comprising:
- a reference-clock-signal generation circuit which generates a reference clock signal;
- a frequency-division circuit which divides the frequency of the reference clock signal by using a natural number equal to or greater than one so as to generate a frequency-divided signal;
- a control circuit which controls the frequency-division circuit so as to modify the frequency-divided signal by inserting extension cycles into the frequency-divided signal at predetermined intervals, and output a modified, frequency-divided signal as the clock signal;
- a supply circuit which supplies to a plurality of portions of the semiconductor device the clock signal generated by the control circuits,
- wherein the frequency-division circuit counts the reference-clock-signal by using a first counter outputting a count value, and divides the frequency of the reference-clock-signal by making an output signal of the frequency-division circuit "H" or "L" according to the count value of the first counter, and
- the control circuit inserts the extension cycles into the frequency-divided signal by temporarily suspending an operation of the first counter.

* * * * *

UNITED STATES PATENT AND TRADEMARK OFFICE
CERTIFICATE OF CORRECTION

| | | |
|---|---|---|
| PATENT NO. | : 7,320,081 B2 | Page 1 of 1 |
| APPLICATION NO. | : 10/386659 | |
| DATED | : January 15, 2008 | |
| INVENTOR(S) | : Nobohiko Akasaka et al. | |

It is certified that error appears in the above-identified patent and that said Letters Patent is hereby corrected as shown below:

IN THE CLAIMS

Column 18, line 3, change "circuits" to --circuit--

Signed and Sealed this

Twenty-seventh Day of May, 2008

JON W. DUDAS
*Director of the United States Patent and Trademark Office*